United States Patent
Tosaka

[19]

[11] Patent Number: 5,808,521
[45] Date of Patent: *Sep. 15, 1998

[54] PRINTED WIRING BOARD WITH THE CHARACTERISTIC IMPEDANCE OF WIRING PATTERN CHANGED ON THE WAY THEREOF

[75] Inventor: Masaki Tosaka, Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 699,037

[22] Filed: Aug. 19, 1996

[30] Foreign Application Priority Data

Feb. 5, 1996 [JP] Japan ..................................... 8-019126

[51] Int. Cl.$^6$ ....................................................... H01P 5/12
[52] U.S. Cl. ............................. 333/128; 333/35; 333/238
[58] Field of Search ............................... 333/33, 35, 124, 333/127, 128, 164, 238, 246

[56] References Cited

U.S. PATENT DOCUMENTS

| | | | |
|---|---|---|---|
| 2,877,427 | 3/1959 | Butler | 333/128 |
| 3,568,097 | 3/1971 | Hultin | 333/164 X |
| 4,947,144 | 8/1990 | Le Nohaic | 333/128 |
| 5,012,047 | 4/1991 | Dohya | 333/238 X |
| 5,229,727 | 7/1993 | Clark et al. | 333/33 |
| 5,270,672 | 12/1993 | Schinzel | 333/246 |
| 5,448,208 | 9/1995 | Honjo | 333/128 |

*Primary Examiner*—Paul Gensler
*Attorney, Agent, or Firm*—Staas & Halsey

[57] ABSTRACT

A printed wiring board having a substrate, a plurality of load circuits formed on the substrate, a drive circuit formed on the substrate, for driving the load circuits, a first wiring pattern formed on the substrate and connected to the load circuits, and a second wiring pattern formed on the substrate, for connecting the drive circuit and the first wiring pattern. The width of the second wiring pattern is set larger than that of the first wiring pattern, so as to eliminate the mismatch between the characteristic impedance of the second wiring pattern and the characteristic impedance of the first wiring pattern.

5 Claims, 8 Drawing Sheets

PRINTED WIRING BOARD WITH THE CHARACTERISTIC IMPEDANCE OF WIRING PATTERN CHANGED ON THE WAY THEREOF

BACKGROUND OF THE INVENTION

1. Field of the Invention

The present invention relates to a printed wiring board applicable to a mother board in a personal computer, for example.

2. Description of the Related Art

In a printed wiring board, a drive circuit for driving a plurality of load circuits (which will be referred to as loads) is formed on a substrate, and a wiring pattern of copper wiring or the like is formed on the substrate and connected to the drive circuit. Further, a plurality of memory circuits as the loads are connected to the wiring pattern, and a plurality of connectors for connecting a plurality of memory module boards are also connected to the wiring pattern. In the case that a plurality of memory elements are mounted on each memory module board, and the plural memory module boards are connected to the wiring pattern by the plural connectors, there is a possibility of occurrence of the mismatch between the characteristic impedance (which will be hereinafter referred to as impedance) of the wiring pattern formed on the substrate and the impedance of each memory module board as the loads. It is therefore desired to provide a printed wiring board which can eliminate this mismatch.

Figure 8:
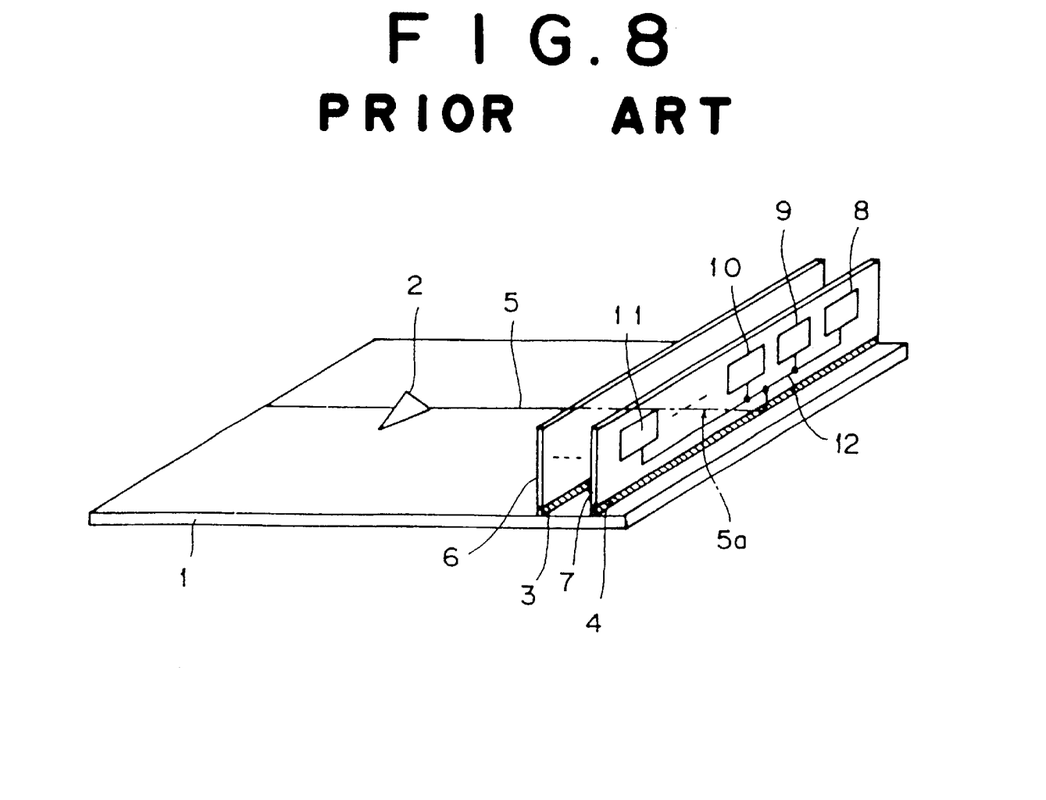
FIG. 8 is a schematic perspective view of a printed wiring board in the prior art.

FIG. 8 is a schematic perspective view showing the configuration of a printed wiring board in the prior art. Referring to FIG. 8, reference numeral 1 denotes a printed wiring board having a substrate, including a drive element 2 mounted on the substrate, a plurality of connectors 3 and 4 mounted on the substrate, and a wiring pattern 5 formed on the substrate, for connecting a signal output of the drive element 2 to each of the connectors 3 and 4. A plurality of memory module boards 6 and 7 are mounted on the connectors 3 and 4, respectively, and a plurality of memory elements 8, 9, 10, and 11 connected together by a wiring pattern 12 are mounted on each of the memory module boards 6 and 7.

The drive element 2 functions to drive the memory module boards 6 and 7, and a control circuit such as a CPU (not shown) is connected to an input of the drive element 2. Although the two memory module boards 6 and 7 are mounted as shown in FIG. 8, the number of such memory module boards to be mounted depends on a device such as a personal computer in which the printed wiring board 1 is used.

In the printed wiring board 1, the impedance Z0 of the wiring pattern 5 is generally obtained by the following equation from an electrostatic capacity C and an inductance L per unit length of the wiring pattern 5.

$$Z0 = \sqrt{(L/C)} \quad (1)$$

Figure 9:
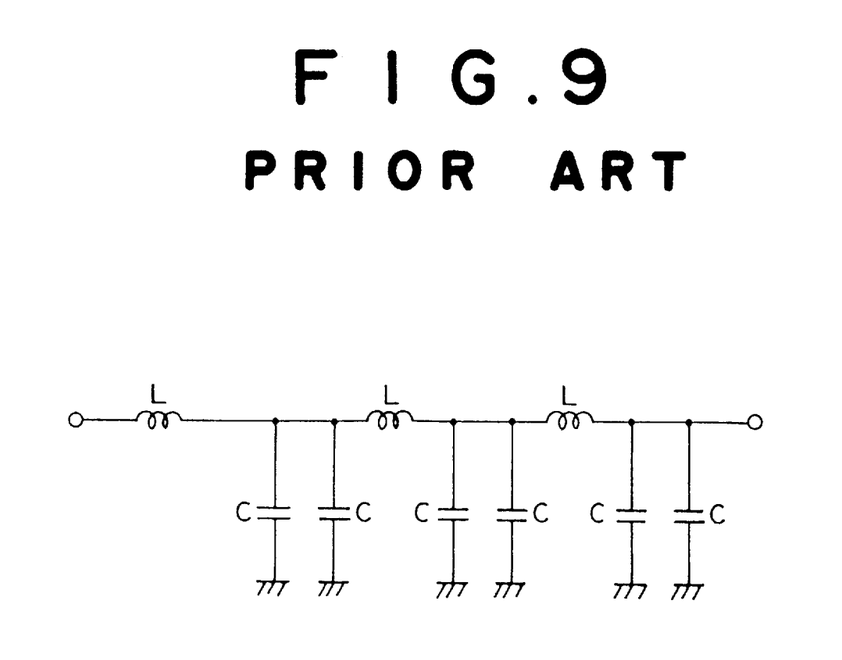
FIG. 9 is a circuit diagram illustrating an electrostatic capacity when the number of loads connected to a wiring pattern of a printed wiring board is enlarged.

In the case where a plurality of loads are distributed on the wiring pattern 5 of the printed wiring board 1, for example, in the case where an excess number of memory module boards as the plural loads on each of which the memory elements 8 to 11 are mounted are connected to the wiring pattern 5, there occurs the mismatch in impedance between a portion 5a of the wiring pattern 5 where the loads are distributed and the other portion of the wiring pattern 5 where the loads are not distributed in spite of the fact that the specification of the wiring pattern 5 is fixed. That is, as shown in FIG. 9, input capacities C owned by the loads are distributed on the wiring pattern 5a, so that the value of C in Eq. (1) is equivalently enlarged to cause a reduction in the impedance Z0 of the wiring pattern 5a. Such a reduction in the impedance Z0 of the wiring pattern 5a to which the loads are connected causes the mismatch in impedance between the wiring pattern 5a and the other portion of the wiring pattern 5.

Figure 10A:
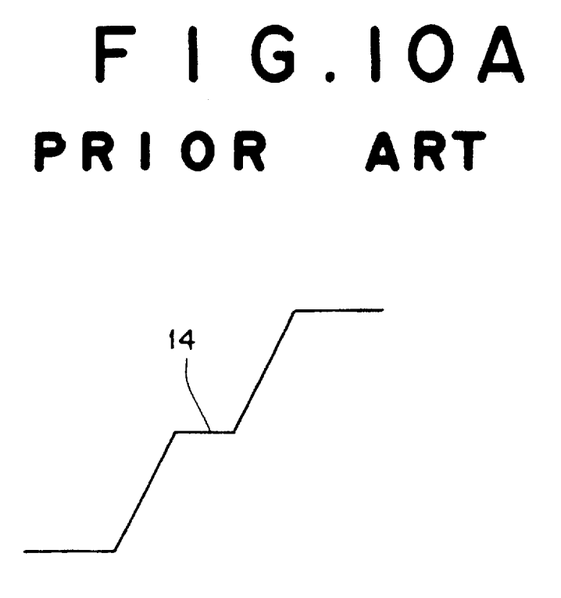
FIGS. 10A and 10B are diagrams illustrating influences of reflection noise to a signal in a printed wiring board.
Figure 10B:
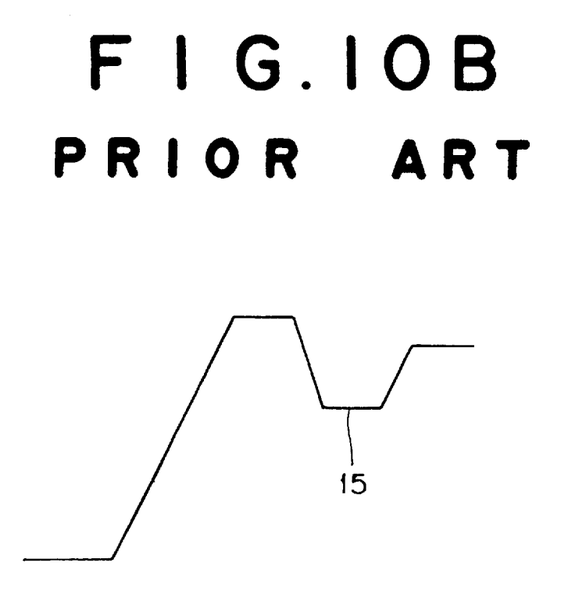

Further, also in such a configuration that the wiring pattern 5 is branched at one end thereof into two or more branch patterns to each of which a given number of loads are connected, the impedance of each branch pattern is reduced to cause the mismatch in impedance between each branch pattern and the other portion of the wiring pattern 5. The occurrence of the impedance mismatch mentioned above causes generation of reflection noise. For example, as shown in FIG. 10A, a stepped change portion 14 occurs in rising of a signal, or as shown in FIG. 10B, a recessed change portion 15 occurs after rising of a signal. When such a change portion appears near a threshold determining the operation of the elements, the malfunction of the device is caused. Further, the degradation of performance of the device is also caused.

SUMMARY OF THE INVENTION

It is therefore an object of the present invention to provide a printed wiring board which can prevent the generation of reflection noise due to the mismatch in impedance between a wiring pattern connected to a plurality of loads and a wiring pattern connecting a drive circuit to the wiring pattern for connection of the loads, thereby allowing connection of more loads.

In accordance with an aspect of the present invention, there is provided a printed wiring board comprising a substrate; a plurality of load circuits formed on the substrate; a drive circuit formed on the substrate, for driving the load circuits; a first wiring pattern formed on the substrate and connected to the load circuits; and a second wiring pattern formed on the substrate, for connecting the drive circuit to the first wiring pattern, the second wiring pattern having a width larger than that of the first wiring pattern.

Since the width of the second wiring pattern is larger than the width of the first wiring pattern, the characteristic impedance of the second wiring pattern can be made lower than the characteristic impedance of the first wiring pattern. As a result, no reflection noise is generated and more loads can be connected to the first wiring pattern as compared with the prior art.

In accordance with another aspect of the present invention, there is provided a printed wiring board assembly comprising a first printed wiring board comprising a first substrate, a plurality of load circuits formed on the first substrate, and a first wiring pattern formed on the first substrate and connected to the load circuits, the first substrate comprising a first ground layer and a first dielectric layer interposed between the first wiring pattern and the first ground layer, the first dielectric layer having a first thickness; a second printed wiring board comprising a second substrate, a drive circuit formed on the second substrate for driving the load circuits, and a second wiring pattern formed on the second substrate and having one end connected to the drive circuit, the second substrate comprising a second ground layer and a second dielectric layer interposed between the second wiring pattern and the second ground layer, the second dielectric layer having a second thickness smaller than the first thickness of the first dielectric layer; and a connector for connecting one end of the first wiring pattern and the other end of the second wiring pattern.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
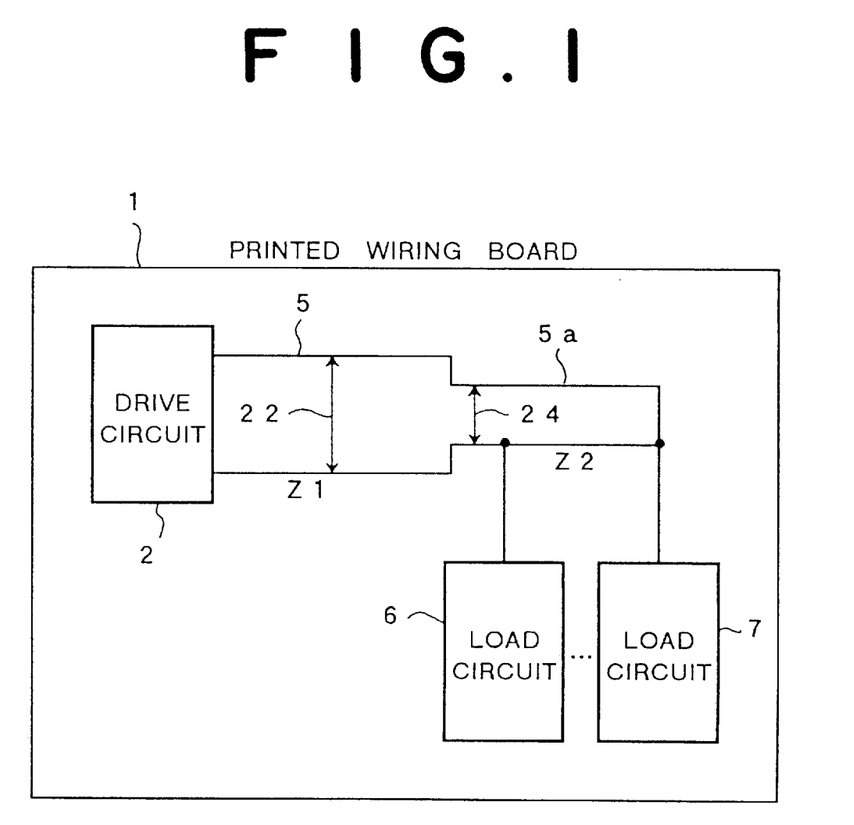
FIG. 1 is a block diagram showing the principle of the present invention.

FIG. 1 shows the principle of a printed wiring board 1 according to the present invention. The printed wiring board 1 shown in FIG. 1 includes a plurality of load circuits 6 and 7, a drive circuit 2 for driving the load circuits 6 and 7, and wiring patterns 5 and 5a for connecting the load circuits 6 and 7 to the drive circuit 2. The present invention is characterized in that the load circuits 6 and 7 are connected to the wiring pattern 5a, and the wiring pattern 5 having a width 22 larger than the width 24 of the wiring pattern 5a is connected to the drive circuit 2 and the wiring pattern 5a.

Thus, the width 22 of the wiring pattern 5 is set larger than the width 24 of the wiring pattern 5a, so that the mismatch between the first characteristic impedance Z1 of the wiring pattern 5 extending from an output end of the drive circuit 2 to one end of the wiring pattern 5a to which the load circuits 6 and 7 are connected and the second characteristic impedance Z2 of the wiring pattern 5a can be eliminated. Accordingly, the first characteristic impedance Z1 becomes lower than the second characteristic impedance Z2. As a result, no reflection noise is generated, and more loads can be connected to the wiring pattern 5a as compared with the prior art.

Figure 2A:
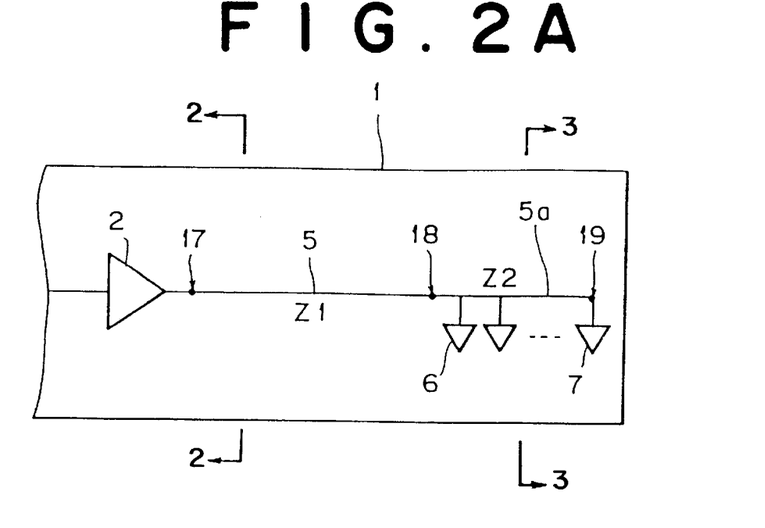
FIG. 2A is a plan view of a printed wiring board according to a first preferred embodiment of the present invention.
Figure 2B:
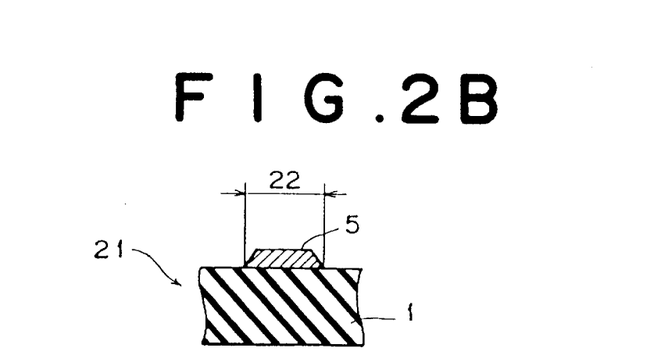
FIG. 2B is a cross section taken along the line 2—2 in FIG. 2A.
Figure 2C:
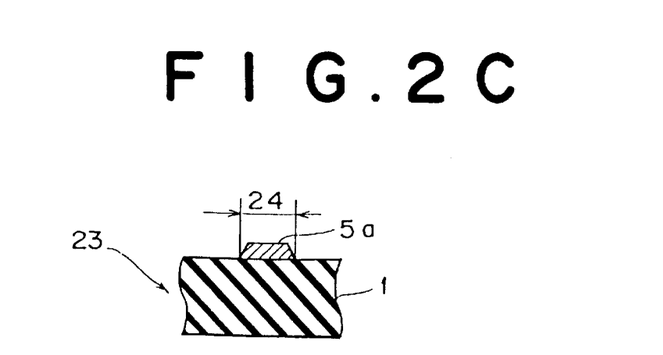
FIG. 2C is a cross section taken along the line 3—3 in FIG. 2A.

FIGS. 2A to 2C illustrate a printed wiring board 1 according to a first preferred embodiment of the present invention. In FIGS. 2A to 2C, parts corresponding to those in the prior art shown in FIG. 8 are denoted by the same reference numerals, and the description thereof will be omitted. The printed wiring board 1 according to the first preferred embodiment shown in FIGS. 2A to 2C is characterized in that the impedance Z1 of a wiring pattern 5 extending between points 17 and 18 is lower than the impedance Z2 of a wiring pattern 5a to which a plurality of memory module boards (which will be hereinafter referred to as loads) 6 and 7 are connected.

That is, in consideration of a reduction in the impedance Z2 due to connection of an excess number of loads 6 and 7 to the wiring pattern 5a as mentioned above with reference to FIG. 8, the impedance Z1 of the wiring pattern 5 is preliminarily lowered. The relation of Z1<Z2 is realized by the configuration that the width 22 of the wiring pattern 5 in a cross section taken along the line A—A in FIG. 2A as shown by reference numeral 21 in FIG. 2B is set larger than the width 24 of the wiring pattern 5a in a cross section taken along the line B—B in FIG. 2A as shown by reference numeral 23 in FIG. 2C. That is, this preferred embodiment utilizes the fact that the impedance of a wiring pattern can be reduced by enlarging the width of the wiring pattern.

The criterion of the reduction of the impedance Z1 from the impedance Z2 is such that when a minimum number of loads are connected to the wiring pattern 5a, there occurs no reflection noise due to a difference between the impedances Z1 and Z2. In the prior art, the specification of the wiring pattern 5 is the same as that of the wiring pattern 5a. In contrast, according to the first preferred embodiment, the impedance Z1 of the wiring pattern 5 extending from an output end of a drive element 2 to one end of the wiring pattern 5a is lower than the impedance Z2 of the wiring pattern 5a. Accordingly, no reflection noise is generated, and more loads can be connected to the wiring pattern 5a as compared with the prior art.

Figure 3:
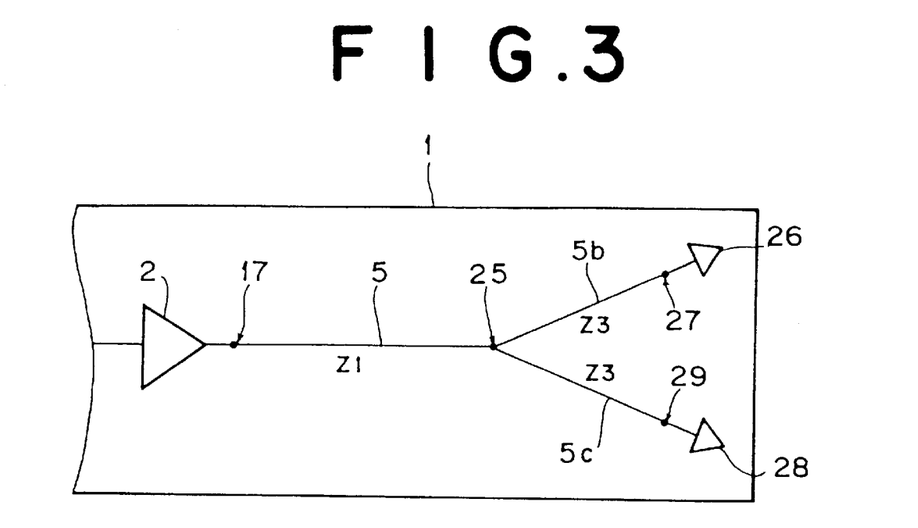
FIG. 3 is a plan view of a printed wiring board according to a second preferred embodiment of the present invention.

A second preferred embodiment of the present invention will now be described with reference to FIG. 3. In the second preferred embodiment shown in FIG. 3, parts corresponding to those of the first preferred embodiment shown in FIGS. 2A to 2C are denoted by the same reference numerals, and the description thereof will be omitted. The second preferred embodiment shown in FIG. 3 is characterized in that a printed wiring board 1 includes a wiring pattern 5 connected at a point 17 to a drive element 2 and branched at a point 25 into two parts, that is, a wiring pattern 5b extending from the branch point 25 to a connection point 27 at which a load 26 is connected and a wiring pattern 5c extending from the branch point 25 to a connection point 29 at which a load 28 is connected, and in that the impedance Z1 of the wiring pattern 5 is lower than the impedance Z3 of each of the wiring patterns 5b and 5c.

Like the first preferred embodiment, the second preferred embodiment also utilizes the fact that the impedance of a wiring pattern can be reduced by enlarging the width of the wiring pattern, and the relation of Z1<Z3 is realized by making the width of the wiring pattern 5 larger than the width of each of the wiring patterns 5b and 5c. Further, like the first preferred embodiment, the criterion of the reduction of the impedance Z1 from the impedance Z3 is such that when a minimum number of loads are connected to each of the wiring patterns 5b and 5c, there occurs no reflection noise due to a difference between the impedances Z1 and Z3. Also in the second preferred embodiment of the type such that the wiring pattern 5 is branched, no reflection noise is generated, and more loads can be connected to each of the wiring patterns 5b and 5c as compared with the prior art.

Figure 4:
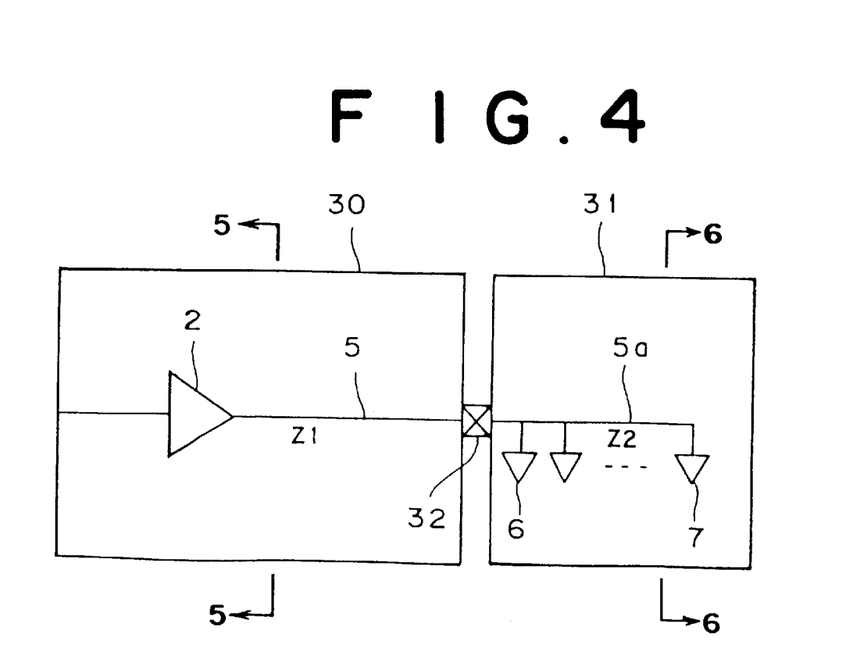
FIG. 4 is a plan view of a printed wiring board according to a third preferred embodiment of the present invention.

A third preferred embodiment of the present invention will now be described with reference to FIG. 4. In the third preferred embodiment shown in FIG. 4, parts corresponding to those of the first preferred embodiment shown in FIGS. 2A to 2C are denoted by the same reference numerals, and the description thereof will be omitted. In the third preferred embodiment shown in FIG. 4, reference numeral 30 denotes a first printed wiring board having a drive element 2 and a wiring pattern 5 connected to an output end of the drive element 2, and reference numeral 31 denotes a second printed wiring board having a wiring pattern 5a to which a plurality of loads 6 and 7 are connected. The wiring pattern 5 and the wiring pattern 5a are connected together by a connector 32.

Figure 5A:
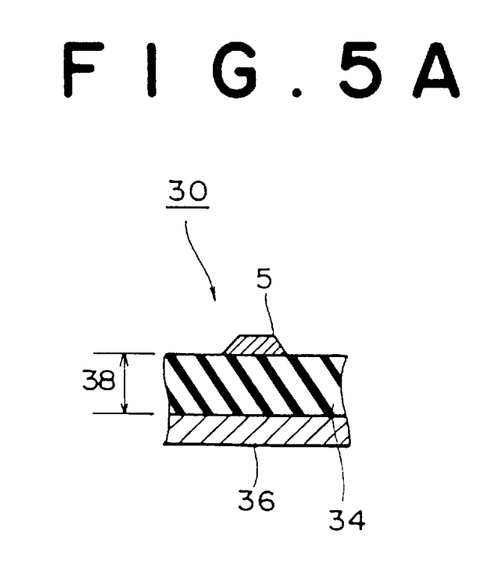
FIG. 5A is a cross section taken along the line 5—5 in FIG. 4.

Like the first preferred embodiment, the impedance Z1 of the wiring pattern 5 is set lower than the impedance Z2 of the wiring pattern 5a. The configuration for realizing the relation of Z1<Z2 will be described with reference to FIGS. 5A and 5B. FIG. 5A is a cross section of the first printed wiring board 30 taken along the line C—C in FIG. 4, and FIG. 5B is a cross section of the second printed wiring board 31 taken along the line D—D in FIG. 4.

Figure 5B:
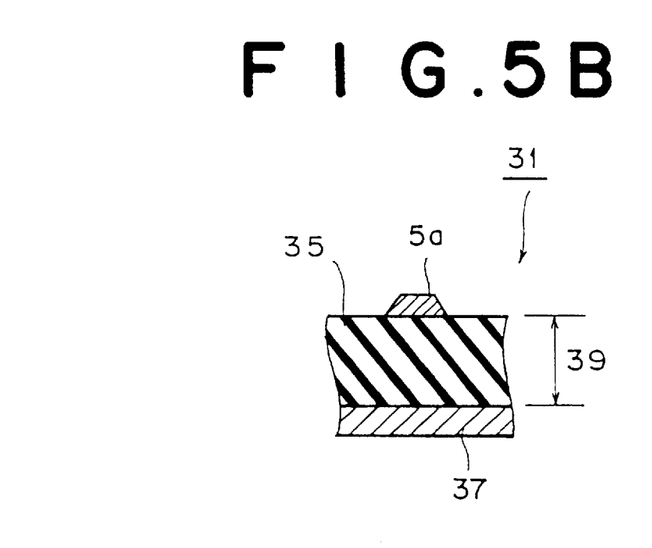
FIG. 5B is a cross section taken along the line 6—6 in FIG. 4.

Referring to FIGS. 5A and 5B, reference numerals 34 and 35 denote dielectric layers, and reference numerals 36 and 37 denote ground layers. The specification of the wiring pattern 5 is the same as that of the wiring pattern 5a. The height 38 of the dielectric layer 34 of the first printed wiring board 30 is set smaller than the height 39 of the dielectric layer 35 of the second printed wiring board 31, thereby making the impedance Z1 of the wiring pattern 5 lower than the impedance Z2 of the wiring pattern 5a. With this configuration, an effect similar to that of the first preferred embodiment can be obtained.

In the case where each of the first printed wiring board 30 and the second printed wiring board 31 is a multilayer board consisting of a dielectric surface layer on which a wiring pattern is formed, at least one dielectric intermediate layer on which a wiring pattern is formed, and a ground layer, the above configuration of making the height 38 of the dielectric layer 34 smaller than the height 39 of the dielectric layer 35 can be realized by forming the wiring pattern 5 between the intermediate layer and the surface layer of the first printed wiring board 30 and forming the wiring pattern 5a on the surface layer of the second printed wiring board 31. Accordingly, the height of the intermediate layer interposed between the wiring pattern 5 and the ground layer of the first printed wiring board 30 can be made smaller than the total height of the surface layer and the intermediate layer interposed between the wiring pattern 5a and the ground layer of the second printed wiring board 31, thus obtaining a configuration similar to that shown in FIGS. 5A and 5B. Further, this configuration using such a multilayer board can be applied also to the single printed wiring board 1 shown in FIG. 2A.

Figure 6A:
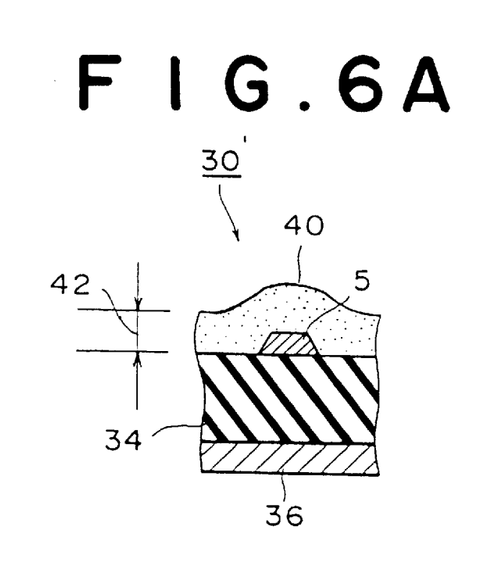
FIG. 6A is a cross section corresponding to the cross section taken along the line 5—5 in FIG. 4, showing a modification of the third preferred embodiment.
Figure 6B:
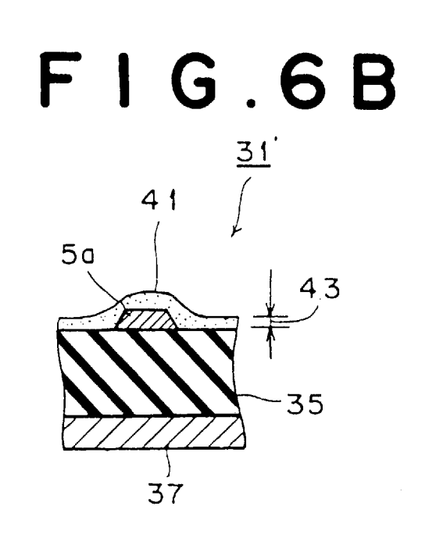
FIG. 6B is a cross section corresponding to the cross section taken along the line 6—6 in FIG. 4, showing the modification.

A similar effect can be obtained by a modification shown in FIGS. 6A and 6B. Referring to FIGS. 6A and 6B, a dielectric layer 34 of a first printed wiring board 30' has the same height as that of a dielectric layer 35 of a second printed wiring board 31', and the thickness 42 of a resist film 40 covering a wiring pattern 5 of the first printed wiring board 30' is set larger than the thickness 43 of a resist film 41 covering a wiring pattern 5a of the second printed wiring board 3140 , thereby making the impedance Z1 of the wiring pattern 5 lower than the impedance Z2 of the wiring pattern 5a. As another modification, the thickness 42 of the resist film 40 may be made equal to the thickness 43 of the resist film 41, and the dielectric layer 34 may be formed of a material having a permittivity larger than that of a material of the dielectric layer 35, thereby making the impedance Z1 of the wiring pattern 5 lower than the impedance Z2 of the wiring pattern 5a.

Figure 7:
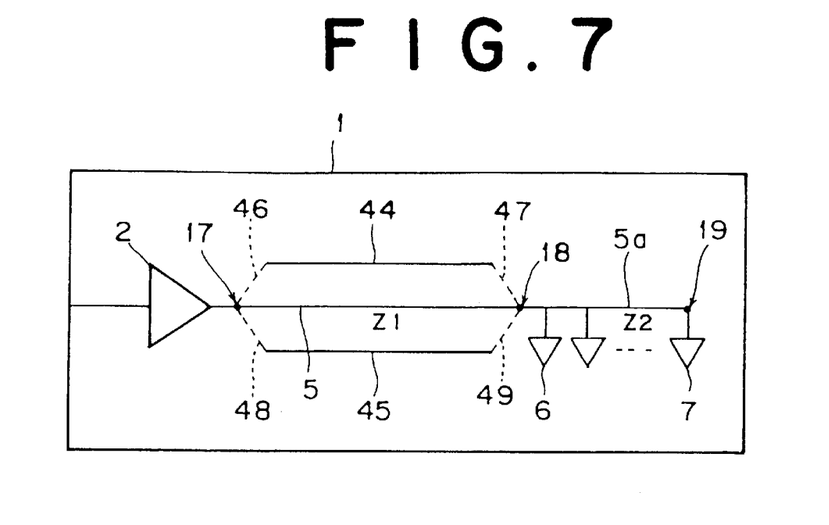
FIG. 7 is a plan view of a printed wiring board according to a fourth preferred embodiment of the present invention.

A fourth preferred embodiment of the present invention will now be described with reference to FIG. 7. In the fourth preferred embodiment shown in FIG. 7, parts corresponding to those of the first preferred embodiment shown in FIG. 2A are denoted by the same reference numerals, and the description thereof will be omitted. In a printed wiring board 1 of this preferred embodiment, the specification of a wiring pattern 5 is the same as that of a wiring pattern 5a, and the impedance Z1 of the wiring pattern 5 is equal to the impedance Z2 of the wiring pattern 5a. The fourth preferred embodiment shown in FIG. 7 is characterized in that two wiring patterns 44 and 45 are provided on both sides of the wiring pattern 5 in parallel thereto, and according to a reduction in impedance Z2 of the wiring pattern 5a due to connection of loads 6 and 7, the opposite ends of the wiring pattern 44 are connected to the wiring pattern 5 as shown by broken lines 46 and 47, and the opposite ends of the wiring pattern 45 are connected to the wiring pattern 5 as shown by broken lines 48 and 49.

That is, in the event that the impedance Z2 of the wiring pattern 5a is reduced by the connection of the loads 6 and 7 to the wiring pattern 5a to cause the mismatch between the impedance Z1 of the wiring pattern 5 and the impedance Z2 of the wiring pattern 5a, generating reflection noise, a required number of wiring patterns 44 and 45 are connected to the wiring pattern 5 to thereby reduce the impedance Z1 of the wiring pattern 5, thereby achieving the impedance matching between the wiring pattern 5 and the wiring pattern 5a to eliminate the reflection noise. According to this configuration, even when an excess number of loads 6 and 7 are actually connected to the wiring pattern 5a to generate the reflection noise, it can be eliminated by preliminarily providing two or more wiring patterns on both sides of the wiring pattern 5.

As described above, according to the present invention, more loads can be connected to a wiring pattern for load connection so that there occurs no reflection noise due to the mismatch in characteristic impedance between the wiring pattern for load connection and a wiring pattern connected between a drive circuit and the wiring pattern for load connection.

What is claimed is:

1. A printed circuit board comprising:
    a substrate;
    a plurality of load circuits formed on said substrate;
    a drive circuit formed on said substrate, for driving said load circuits;
    a single first wiring pattern formed on said substrate and connected to each of said load circuits, said first wiring pattern having a constant width;
    a second wiring pattern formed on said substrate, for connecting said drive circuit to said first wiring pattern, said second wiring pattern having a constant width larger than the constant width of said first wiring pattern.

2. A printed wiring board assembly comprising:

a second printed wiring board including a first substrate, a plurality of load circuits formed on said first substrate, and a single first wiring pattern formed on said first substrate and connected to said load circuits, said first substrate including a first ground layer and a first dielectric layer interposed between said first wiring pattern and said first ground layer, said first dielectric layer having a first thickness;

a first printed wiring board including a second substrate, a drive circuit formed on said second substrate for driving said load circuits, and a second wiring pattern formed on said second substrate and having one end connected to said drive circuit, said second substrate including a second ground layer and a second dielectric layer interposed between said second wiring pattern and said second ground layer, said second dielectric layer having a second thickness smaller than said first thickness of said first dielectric layer; and a connector for connecting one end of said first wiring pattern and the other end of said second wiring pattern.

3. A printed wiring board assembly comprising:

a second printed wiring board including a first substrate, a plurality of load circuits formed on said first substrate, a single wiring pattern formed on said first substrate and connected to each of said load circuits, and a first resist film formed on said first substrate so as to cover said first wiring pattern, said first resist film having a first thickness;

a first printed wiring board including a second substrate, a drive circuit formed on said second substrate for driving said load circuits, a second wiring pattern formed on said second substrate and having one end connected to said drive circuit, and a second resist film formed on said second substrate so as to cover said second wiring pattern, said second resist film having a second thickness larger than said first thickness of said first resist film; and a connector for connecting one end of said first wiring pattern and the other end of said second wiring pattern.

4. A printed wiring board assembly comprising:

a second printed wiring board including a first substrate, a plurality of load circuits formed on said first substrate, and a single first wiring pattern formed on said first substrate and connected to each of said load circuits, said first substrate including a first ground layer and a first dielectric layer interposed between said first wiring pattern and said first ground layer, said first dielectric layer having a first permittivity;

a first printed wiring board including a second substrate, a drive circuit formed on said second substrate for driving said load circuits, and a second wiring pattern formed on said second substrate and having one end connected to said drive circuit, said second substrate including a second ground layer and a second dielectric layer interposed between said second wiring pattern and said second ground layer, said second dielectric layer having a second permittivity larger than said first permittivity of said first dielectric layer; and a connector for connecting one end of said first wiring pattern and the other end of said second wiring pattern.

5. A printed wiring board comprising:

a substrate;

a plurality of load circuits formed on said substrate;

a drive circuit formed on said substrate, for driving said load circuits;

a single first wiring pattern formed on said substrate and connected to each of said load circuits;

a plurality of second wiring patterns formed on said substrate, for connecting said drive circuit and said first wiring pattern;

wherein at least one of said second wiring patterns is disconnectable from said drive circuit and said first wiring pattern.

* * * * *